United States Patent [19]

Palara

[11] Patent Number: 5,665,994
[45] Date of Patent: Sep. 9, 1997

[54] INTEGRATED DEVICE WITH A BIPOLAR TRANSISTOR AND A MOSFET TRANSISTOR IN AN EMITTER SWITCHING CONFIGURATION

[75] Inventor: Sergio Palara, Catania, Italy

[73] Assignee: CO.RI.M.ME. Consorzio per la Ricerca sulla Microelettronica nel Mezzogiorno, Catania, Italy

[21] Appl. No.: 307,877

[22] Filed: Sep. 16, 1994

[30] Foreign Application Priority Data

Sep. 17, 1993 [EP] European Pat. Off. ............ 93830385

[51] Int. Cl.$^6$ .......................... H01L 29/76; H01L 29/00
[52] U.S. Cl. .......................... 257/378; 257/509; 257/500
[58] Field of Search .......................... 257/378, 370, 257/329, 334, 335, 506, 509, 526

[56] References Cited

U.S. PATENT DOCUMENTS 5,317,182  5/1994  Zambrano et al. .................. 257/378

FOREIGN PATENT DOCUMENTS

| A-0 247 660 | 12/1987 | European Pat. Off. | 27/6 |
| A-0 322 041 | 6/1989 | European Pat. Off. | 27/6 |
| A-01 305 557 | 12/1989 | Japan | 27/6 |
| A-02 254 757 | 10/1990 | Japan | 29/784 |

Primary Examiner—Wael Fahmy
Attorney, Agent, or Firm—David V. Carlson; Bryan A. Santarelli; Seed and Berry LLP

[57] ABSTRACT

A device integrated on a chip of a semiconductor material is disclosed which comprises an NPN bipolar transistor and an N-channel MOSFET transistor in an emitter switching configuration, both being vertical conduction types. The bipolar transistor has its base and emitter regions buried; the MOSFET transistor is formed with an N region bounded by the base and the emitter regions and isolated by a deep base contact and isolation region. To improve the device performance, especially at large currents, an N+ region is provided which extends from the front of the chip inwards of the isolated region and around the MOSFET transistor. In one embodiment of the invention, a MOSFET drive transistor is integrated which has its drain terminal in common with the collector of the bipolar transistor, its source terminal connected to the base of the bipolar transistor, and its gate electrode connected to the gate electrode of the MOSFET transistor in the emitter switching configuration.

20 Claims, 2 Drawing Sheets

INTEGRATED DEVICE WITH A BIPOLAR TRANSISTOR AND A MOSFET TRANSISTOR IN AN EMITTER SWITCHING CONFIGURATION

BACKGROUND OF THE INVENTION

This invention relates to monolithic integrated semiconductor structures, in particular to an integrated device comprising a bipolar transistor and a MOSFET transistor, both of the vertical conduction type and connected together into an emitter switching configuration.

As is known, an emitter switching configuration is composed of a vertical bipolar transistor, usually a high-voltage power transistor, and an electronic switch in series with the emitter of the bipolar transistor. Typically, the electronic switch is a low-voltage MOSFET power transistor with its drain terminal connected to the emitter terminal of the bipolar transistor. The electronic switch "break" quickly cuts off the bipolar transistor. Such an advantage is useful in those applications where the bipolar transistor is to be to switched between its conductive and non-conductive states at a fast rate.

An integrated structure of a device including a bipolar power transistor and a MOSFET transistor in the above-described configuration is disclosed in European Patent Application EP 88202899.6 filed on 16 Dec. 1988 by SGS-THOMSON MICROELECTRONICS. Briefly, that structure, also shown in FIG. 1 of the drawings that accompany this specification, is formed on a substrate 10 of a semiconductor material, e.g., a chip of monocrystalline silicon, of the N+ type, that is having a high concentration of impurities of the N type. (Notice that, in the drawing, the concentrations of impurities of the N type and the P type are identified as customary by the addition of a sign "−" or "+" to the characters N and P; the characters N and P alone denote concentrations of intermediate value.)

Formed on the front surface of substrate 10 are two epitaxial layers 11 and 12 of the N− and N types, respectively. The layer 11 and the substrate 10, together contain the collector region of the bipolar transistor. A metallic layer 28, applied on the back surface of substrate 10, forms the collector terminal C.

A P− region 13, formed between the epitaxial layers 11 and 12 and commonly referred to as a buried region, forms the base region of the transistor. A P+ isolation and deep base contact region 15 extends from the front surface of the chip to the edge of the base region 13, and encloses an isolated N region 16. An N+ buried region 14 forms a junction with P− region 13 and constitutes the emitter region of the bipolar transistor.

A P region 25 extends within the isolated region 16, which constitutes the body region of the MOSFET transistor and contains the transistor channel. Formed within P region 25 is a region 26 constituting the source region of the MOSFET transistor. A strip 22 of an electrically conductive material, which overlies the channel and is insulated from the chip surface, constitutes the gate electrode, which is terminal G of the device.

Electrically conductive surface contact strips 4 and 5 are formed on the source region 26 and the isolation region 15, respectively, to provide the source terminal S of the MOSFET transistor and the base terminal B of the bipolar transistor, respectively. The drain region of the MOSFET transistor is provided by the portion of the N layer 12 that is included between the buffed emitter region 14 and the body region 25 and is unconnected to external electrodes.

The above-described structure can be implemented in an extremely compact form by virtue of the overlapped arrangement of the two transistors. However, it has been found that this beneficial feature cannot be fully exploited because the device performance rapidly deteriorates to become unacceptable as the distance of the body region 25 of the MOSFET transistor to the isolation and deep base contact region 15 drops below a certain limit value. Specifically, it has been observed that in such cases the bipolar transistor gain decreases drastically as the collector current increases.

In addition, the above-described device requires separate driver circuits for the two transistors because, as is well recognized, the bipolar transistor is current driven, whereas the MOSFET transistor is voltage driven. Thus, separate drivers are used even in those applications where the control signals to the two transistors are simultaneous and of the same sign, such as in a switching power supply. In such cases, the need for separate drivers further reduces the benefits to be derived from the compact design of the structure.

SUMMARY OF THE INVENTION

According to the invention, an additional N+ region that extends from the front surface of the chip to the interior of the isolated N region and surrounds the body region of the MOSFET transistor is provided.

An object of the invention is to provide a compact integrated device as indicated, which can be used to advantage in applications providing for simultaneous commands with the same sign to the two transistors. According to the invention, the object is achieved by providing a MOSFET drive transistor integrated on a chip of semiconductor material and having its drain and source terminals connected to the collector and the base terminals, respectively, of the bipolar transistor, and its gate electrode connected to the gate electrode of the MOSFET switching transistor, which is coupled to the emitter of the bipolar transistor.

The invention can be more clearly understood, and its advantages appreciated, from the following description thereof, given by way of example and not of limitation with reference to the accompanying drawings.

DESCRIPTION OF THE PREFERRED EMBODIMENTS

Figure 1:
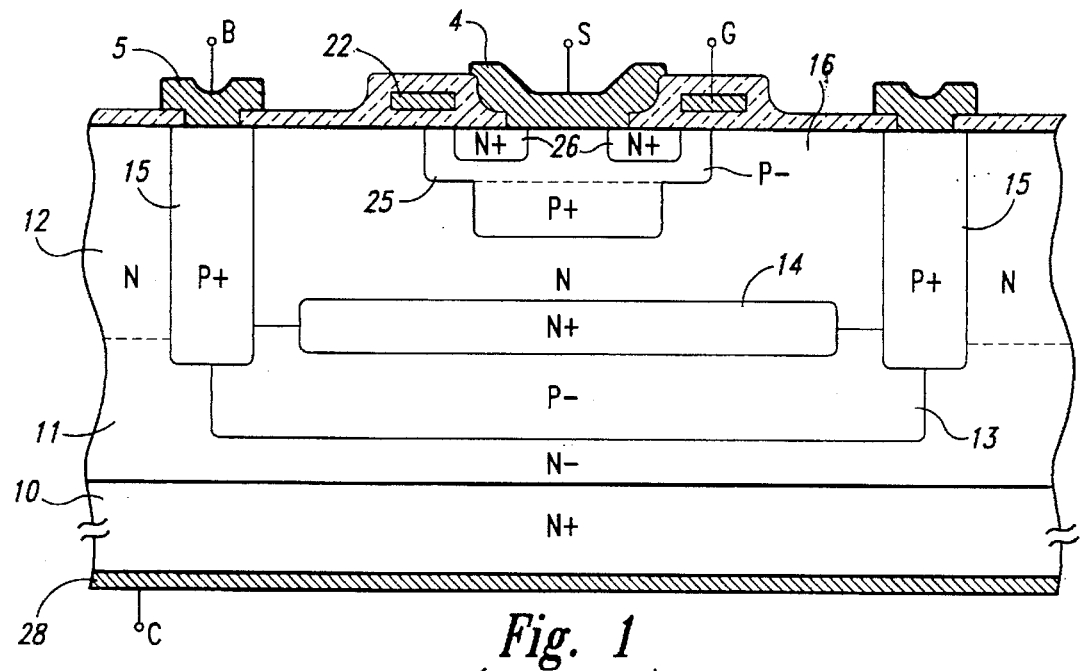
FIG. 1, already described, is a sectional view through the structure of a prior art integrated device.
Figure 2:
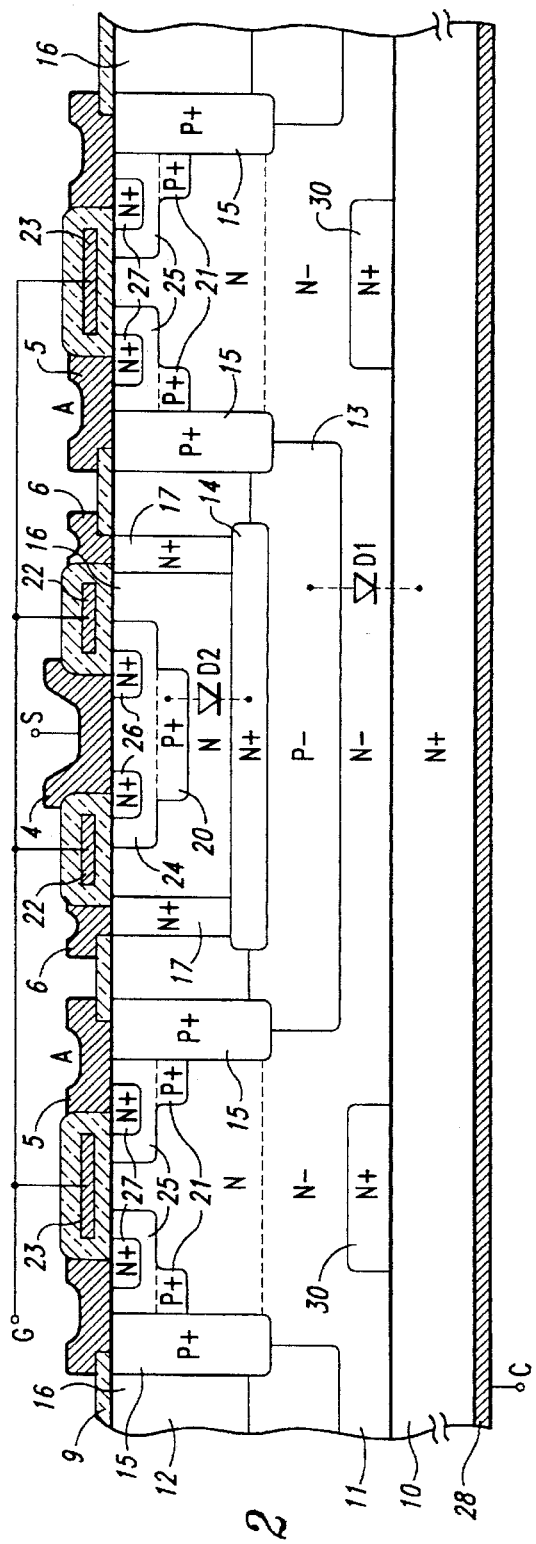
FIG. 2 is a sectional view through the structure of an integrated device according to one embodiment of the invention.

The structure of a device according to the invention— shown in FIG. 2, where similar or corresponding parts to those in FIG. 1 are denoted by the same reference numerals or symbols—is formed on a chip of a semiconductor material of the N type, starting with a substrate 10 of monocrystalline silicon which is heavily doped with impurities of the N type. On the substrate 10, there is formed, as by epitaxial growth, a first layer 11 having the same type of N conductivity, but at a much lower concentration of impurities, and accordingly denoted by N−. Formed by implantation on the surface of the epitaxial layer 11 are P-type regions that have comparatively low concentrations of impurities, whereafter N-type regions with high concentrations of impurities are implanted substantially within the P-type regions. A second layer 12 of the N type and having a higher concentration of impurities than the first layer 11 is formed over the layer 11 by epitaxial growth. During this step, which is carded out at a high temperature, the implanted regions of the P and N types are allowed to expand by diffusion into the two epitaxial layers to provide the buried regions shown in the drawing at 13 and 14, respectively, and which together form a junction and provide the base and emitter regions, respectively, of the bipolar transistor. In the second epitaxial layer 12, there are then formed, using conventional masking and diffusing techniques, P+ regions 15, which extend through the second epitaxial layer 12, merge with the regions 13, and provide isolation and deep contact base regions for the bipolar transistor.

In plan view, the regions 13 and 14 are in the form of concentrically arranged squares or circles, and the regions 15 are each in the form of a square or circular frame, and accordingly, bound inwardly portions of the second epitaxial layer 12, which are closed at the bottom by the regions 13 and 14, thereby forming N-type wells 16, which are isolated from one another.

Shown in FIG. 2 is a portion of a cellular structure formed by sundry isolated wells 16. Formed in each of the wells is a basic bipolar transistor, while outwards from each of the isolation regions 15 which bound the wells, there is formed a basic MOSFET transistor. A structure of this type is described in this Applicant's European Patent Application No. EP 93830255.1. However, it will be appreciated that the inventive device may be implemented with individual transistors of discrete construction.

Subsequently, additional N-type regions 17 (having a high concentration of impurities) are formed, each inside one well 16 and also in the form of square or cylindrical frames. In the example shown, regions 17 extend as far as their respective buried regions 14, although lesser distances of extension are within the spirit and scope of the invention. That is, regions 17 may extend inside the wells 16 without merging with the buffed regions 14. In such a case, regions 17 may extend sideways to touch the deep contact and isolation regions 15.

Within the area of each well 16 that is bounded by the additional region 17, there is formed a P+ region 20, which constitutes the deep body of a MOSFET transistor. Similar P+ regions 21 are formed along the outward edges of the contact and isolation regions 15, and also constitute deep body regions.

Next, a layer of polycrystalline silicon is formed over a thin layer of a dielectric material to form the gate electrodes 22 and 23 of the MOSFET switching and drive transistors, respectively. Such electrodes are electrically coupled and led to a common gate terminal G, which also is one of the device terminals.

P-type regions 24 and 25 are next formed with lower concentrations of impurities than regions 20 and 21 to provide the bodies of the MOSFET transistors, which extend across their respective body regions 20 and 21. Next, formed within body regions 24 and 25 are N+ regions 26 and 27, which constitute the source regions of their respective MOSFET transistors.

Thereafter, electric interconnection paths are formed across the front surface of the chip, which is coated with a layer of silicon dioxide 9 using existing deposition, masking and etching techniques. Specifically, metallic strips 4, 5 and 6 are formed. Strips 4 contact selected surface areas of the deep body 20, body 24, and source 26 regions, and constitute the source terminal of one of the MOSFET transistors (the MOSFET switching transistor) and the device terminal designated S. The strips 5 contact selected surface areas of the deep body 21, the body 25, and the source 27 of the other of the MOSFET transistors, and the strips 6 contact the additional regions 17. However, the contact strips 6 are not required for practicing the invention in its broadest form, but are useful to provide a specially advantageous circuit configuration explained with respect to other embodiments herein. The strips 5, in addition to coupling the body and source regions together, provide contact with the base regions 13 through the deep contact and isolation regions 15. Finally, a metallic layer 28 is formed on the bottom of the substrate 10, the former constituting the common collector and drain terminal C of the device.

In the example shown, the integrated structure includes a buried region of the N type with a high concentration of impurities within the drain region of the MOSFET drive transistor, which is outside the isolated region 16, where the drain current is largest. The region 30 is provided, before the epitaxial layer 11 is grown, by forming an intermediate epitaxial layer and implanting impurities of the N type in those areas thereof where the drain regions are to be formed. In the course of the following thermal processes whereby the epitaxial layers 11 and 12 are formed, the implanted impurities will diffuse both into the intermediate epitaxial layer and the first epitaxial layer 11 to form the region 30. Inasmuch as the region 30 substitutes a high-conductivity material for part of the low-conductivity drain region, the resistance between the drain and the source of the MOSFET transistor will be decreased. Table I lists acceptable dopants and suitable doping levels for the listed semiconductor regions in one embodiment of the FIG. 2 structure.

TABLE I

| REGION | DOPANT | DOPING LEVEL (Atom/cm$^3$) |
|---|---|---|
| 10 | (N+) Sb | $1 \times 10^{19}$ |
| 11 | (N−) P | $6 \times 10^{13}$ |
| 30 | (N+) P | $1 \times 10^{15}$ |
| 13 | (P−) B | $1 \times 10^{13}$ |
| 14 | (N+) Sb | $3 \times 10^{15}$ |
| 15 | (P+) B | $2 \times 10^{15}$ |
| 12 | (N) P | $2 \times 10^{14}$ |
| 16 | (N) P | $2 \times 10^{14}$ |
| 17 | (N+) P | $1 \times 10^{18}$ |
| 20 | (P+) B | $2 \times 10^{13}$ |
| 21 | (P+) B | $2 \times 10^{13}$ |
| 24 | (P) B | $1 \times 10^{13}$ |
| 26 | (N+) As | $3 \times 10^{15}$ |
| 27 | (N+) As | $3 \times 10^{15}$ |
| 25 | (P) B | $1 \times 10^{13}$ |
| 22 | (P+) As | $5 \times 10^{16}$ |
| 23 | (P+) As | $5 \times 10^{16}$ |

As can be appreciated, with different technologies, the dopant and doping levels may be different and still take advantage of the present invention. The integrated structure described in the foregoing constitutes a device that may be represented by the equivalent electric circuit shown in FIG. 3. Indicated at T2 is a bipolar transistor of the NPN type, and at T1 and T3, two N-channel MOSFET transistors.

T3 and T2 are coupled in an emitter switching configuration. T1 is connected to T2 in a Darlington type of configuration, of which T1 forms the driver stage and has its gate electrode connected to the gate electrode of T3. The gate electrode of T1, collector of T2, and source of T3, respectively designated G, C and S, constitute the terminals of the integrated device.

As can be appreciated, the emitter and base regions of T2 are formed by the regions indicated at 14 and 13, respectively, in FIG. 2, and the collector region of T2 is formed essentially by the areas of the epitaxial layer 11 and the substrate 10 which underlie the base region 13. The source region of T3 consists of the N+ region 26, which is connected to the body 24 and deep body 20 regions by the metallic strip 4, which is connected to the terminal S of the device. The drain region of T3 consists of the area of the epitaxial layer 12 which underlies the deep body region 20 and borders the emitter region 14. The source region of T1 consists of the N+ region 27, which is connected to the deep body region 21 and the deep contact and isolation region 15 by the metallic strip 5. The drain region of T1 consists of the areas of the epitaxial layers 12 and 11 which underlie the body and deep body regions 25 and 21, as well as of the region 30 and the underlying substrate 10. The common collector terminal of T2 and drain terminal of T1 constitute the terminal C of the device, and the gate electrodes 22 and 23 of the MOSFET transistors T3 and T1, respectively, are joined together and form the terminal G of the device.

With the device described hereinabove, the invention objects are fully achieved. In particular, it has been found that the gain of the bipolar transistor T2 can be kept virtually constant even at large currents. This is believed to be attributable to the additional N+ region 17 preventing the formation of parasitic components between the body region 24 and the isolation region 15, which would otherwise draw current from the base of T2. Furthermore, the MOSFET transistor T1 affords simultaneous voltage control, via the single terminal G, of the two components, T2 and T3, of the emitter switching configuration.

In the embodiment illustrated, moreover, T1 and T2 are constructed and interconnected to provide a device of the Darlington type wherein the series resistance of the driver stage is peculiarly low. The resultant three-terminal device is, in conclusion, extremely compact, has a substantially constant gain even at large currents, and can be used to advantage in those applications where a relatively large current is to be switched rapidly.

Figure 3:
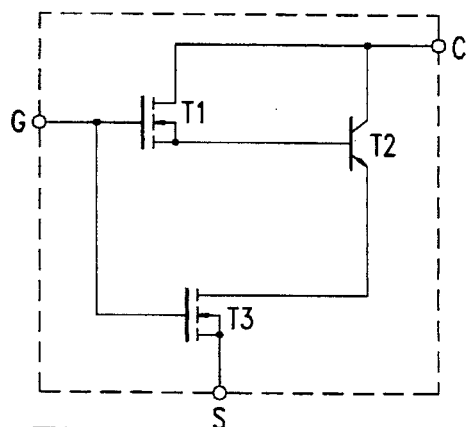
FIG. 3 shows an equivalent electric circuit of the structure shown in FIG. 2.
Figure 4:
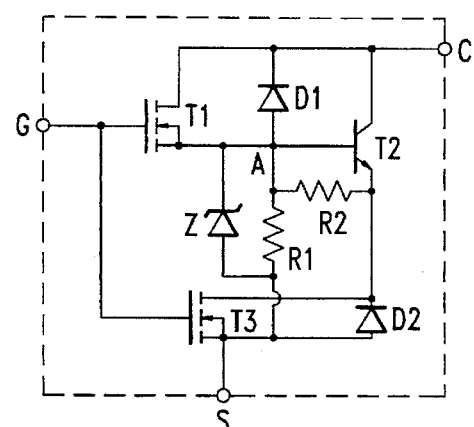
FIG. 4 shows an equivalent electric circuit of the structure shown in FIG. 2 where certain components have been added thereto.

To further improve the switching speed of the device, various arrangements can be provided using techniques known to those of skill in the art. In FIG. 4, where similar components to those in FIG. 3 are denoted by the same reference symbols, some components have been added to the structure described above. These components can be integrated on the same silicon chip using known techniques. Specifically, these are: a Zener diode connected between the source terminal of T3 and the base contact, designated A in both FIG. 4 and FIG. 2, of T2; T2; and two resistors R1 and R2 connected between the base of T2 and, respectively, the source of T3 and the emitter of T2. The use of the metallic layer 6 can now be fully appreciated: in fact, it functions to connect the emitter of T2, i.e., the N+ region 14, to the resistors R1 and R2 through the additional region 17. Notice that two diodes, designated D1 and D2, are also shown in FIG. 4 which are connected between the source and the drain terminals of the MOSFET transistors T1 and T3, respectively, and result inherently from a MOSFET transistor structure of this kind. The circuit symbol for the two diodes is also shown in FIG. 2 for convenient location of the regions that form their respective anodes and cathodes.

Figure 6:
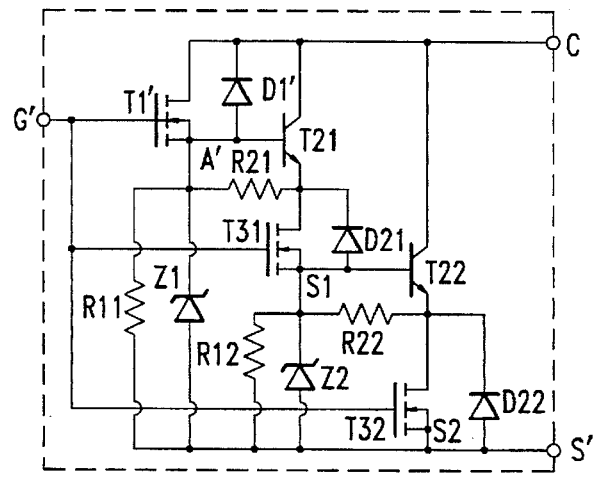
FIG. 6 shows an equivalent electric circuit of the structure shown in FIG. 5 with certain components added thereto.
Figure 5:
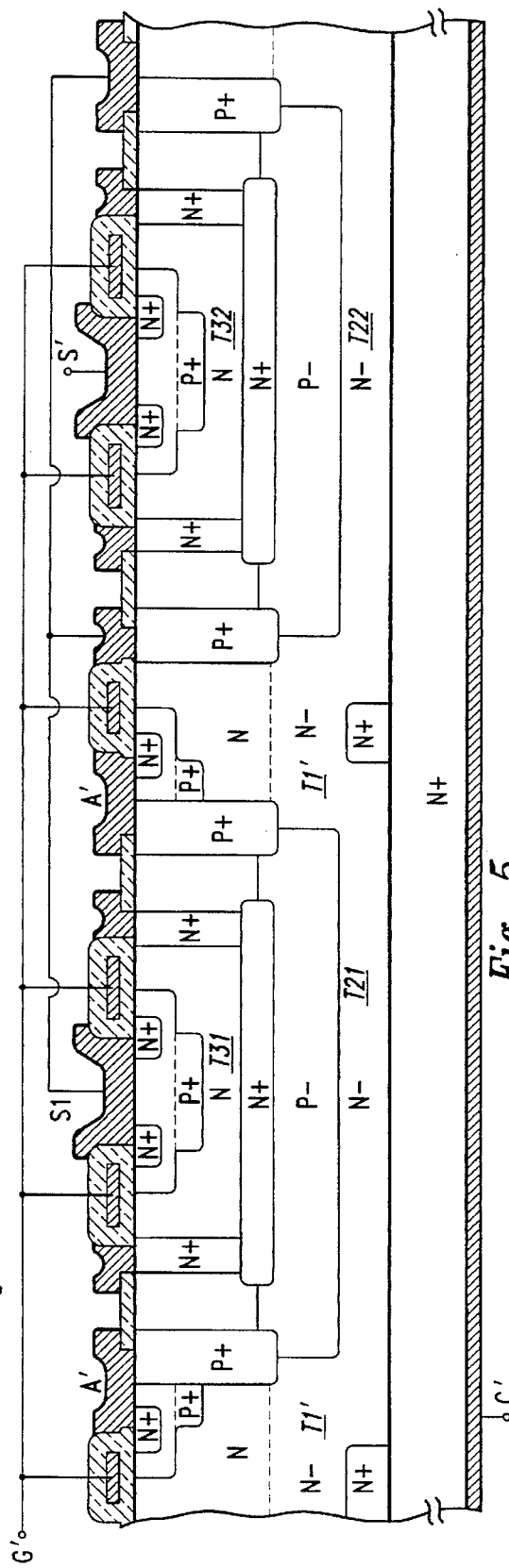
FIG. 5 is a sectional view through the structure of an integrated device according to another embodiment of the invention.

A device which suits even faster switching applications is illustrated by the structure cross-section of FIG. 5 and its equivalent electric circuit in FIG. 6. The device comprises first and second transistor pairs (one transistor of a pair being bipolar and the other a MOSFET), which are connected in the emitter switching configuration shown in FIGS. 2 and 4, and a MOSFET drive transistor that is similar to the MOSFET drive transistor of FIGS. 2 and 4. In FIG. 6, the components of the first and the second pairs are denoted by the same reference numerals and symbols as in FIG. 4 with a "1" and "2" suffix added, respectively, and the equivalent components of those in FIG. 4 by the same reference numerals and symbols primed. Shown in FIG. 5 are the reference symbols for the transistors, which identify their respective collector and drain regions, plus a few more references that are used in FIG. 6.

The two emitter switching configurations are cascade connected together. Specifically, the collector terminals of the two bipolar transistors T21 and T22 consist of the same metallic layer, which extends across the back surface of the substrate and forms a terminal C' of the device; the source terminal S1 of the MOSFET transistor T31 in the first pair is connected to the base terminal of the bipolar transistor T22 in the second pair. The source terminal S2 of the MOSFET transistor T32 in the second pair also forms a terminal S'. The MOSFET drive transistor T1' has its drain terminal connected to the common collector terminal of the bipolar transistors in both pairs, its source terminal A' connected to the base terminal of the bipolar transistor T21 in the first pair, and its gate electrode connected to the gate electrodes of the MOSFET transistors T31 and T32 in both pairs, as well as to a third terminal G' of the device. The various components in the diagram of FIG. 6 can be readily identified in FIG. 5 from the previous description of FIG. 2 and with the aid of the reference symbols entered.

While only the above-described embodiments of the invention have been illustrated and described, it is understood that many changes and modifications may be made thereto within the scope of this inventive concept. For example, the device drive transistor, rather than being formed as a vertical conduction MOSFET transistor as disclosed above, could be a horizontal conduction MOSFET transistor integrated on the same chip; or the drive transistor may be excluded from the integrated device, in which case the integrated device would comprise only a bipolar transistor and a MOSFET transistor in the emitter switching configuration, as disclosed, and have four terminals, namely the terminal common to the collector terminal of the bipolar transistor and the drain terminal of the MOSFET transistor, the base terminal of the bipolar transistor, and the source and gate terminals of the MOSFET transistor. Also, as shown in FIG. 5, the N+ regions 17 may extend only partially down from the front surface of the integrated circuit. That is, N+ regions 17 need not contact regions 14.

I claim:

1. A device comprising at least a pair of transistors, namely a bipolar one and a MOSFET one, connected into an emitter switching configuration and integrated on a semiconductor material, which device comprises:

a substrate of the N type having a first surface, a second opposite surface, and a high concentration of impurities;

at least one layer of the N type overlying the first surface of the substrate and having a lower concentration of impurities than the substrate, such layer and substrate including the collector region of the bipolar transistor;

a metallic layer which extends across the second opposite surface of the substrate from the at least one layer and constitutes the collector terminal of the bipolar transistor;

a region of the P type having a low concentration of impurities which is buried in the N-type layer and includes the base region of the bipolar transistor;

an isolation region of the P type having a high concentration of impurities and extending from a front surface of the at least one layer overlying the substrate, as far as the edge of the base region, thereby bounding inwardly an isolated region of the N type which includes the drain region of the MOSFET transistor;

electrically conductive means of contact on said isolation region which include the base terminal of the bipolar transistor;

a buried region of the N type having a high concentration of impurities which forms a junction with the base region and includes the emitter region of the bipolar transistor;

a region of the P type which extends from the front surface of the at least one layer overlying the substrate inwards of the isolated region and includes the channel of the MOSFET transistor;

a region of the N type having a high concentration of impurities which extends from the front surface of the at least one layer overlying the substrate in said region of the P type including the channel of the MOSFET transistor and includes the source region of the MOSFET transistor;

electrically conductive means of contact on said source region which include the source terminal of the MOSFET transistor;

a strip of an electrically conductive material overlying the channel, being insulated from the front surface of the at least one layer overlying the substrate by a layer of an insulating material, and including the gate electrode of the MOSFET transistor; and an additional region of the N type having a high concentration of impurities and extending from the front surface of the at least one layer overlying the substrate inwards of the isolated region of the N type and surrounding the region of the P type which includes the channel.

2. A device according to claim 1, wherein the additional region of the N type extends as far as the buried region of the N type.

3. A device according to claim 1, wherein the collector terminal and base terminal of the bipolar transistor and the source terminal and gate electrode of the MOSFET transistor in the emitter switching configuration form the terminals of the device.

4. A device according to claim 1, comprising a MOSFET drive transistor integrated on the at least one layer overlying the substrate of semiconductor material and having its drain terminal connected to the collector terminal of the bipolar transistor, its source terminal connected to the base terminal of the bipolar transistor, and its gate electrode connected to the gate electrode of the MOSFET transistor in the emitter switching configuration, the collector terminal of the bipolar transistor, the source terminal and gate electrode of the MOSFET transistor in the pair forming the terminals of the device.

5. A device according to claim 4 comprising:

an outward region of the P type including the channel of MOSFET drive transistor and extending from the front surface of the at least one layer overlying the substrate in the N-type layer proximate to the outward edge of the isolation region;

a region of the N type having a high concentration of impurities and extending from the front surface of the at least one layer overlying the substrate in said outward region of the P type including the source region of the MOSFET drive transistor;

a strip of an electrically conductive material overlying the channel of the MOSFET drive transistor, being isulated from the front surface of the at least one layer overlying the substrate by a layer of an insulating material, and including the gate electrode of the MOSFET drive transistor;

a region being part of the N-type layer overlying the substrate, being bounded by said outward region of the P type and the substrate, and forming with the latter the drain region of the MOSFET drive transistor; and electrically conductive means of interconnection between the gate electrodes of the two MOSFET transistors.

6. A device according to claim 5, comprising, within the region being part of the N-type layer which forms the drain region of the MOSFET drive transistor, a buried region of the N type having a high concentration of impurities.

7. A device according to claim 1, comprising first and second pairs of transistors, a bipolar one and a MOSFET one, in the emitter switching configuration, and wherein the collector terminals of the bipolar transistors in both pairs are formed of the same metallic layer which extends over the surface of the substrate, the source terminal of the MOSFET transistor in the first pair is connected to the base terminal of the bipolar transistor in the second pair, said device further comprising a MOSFET drive transistor integrated on the at least one layer overlying the substrate of semiconductor material and having its drain terminal connected to the collector terminals of the bipolar transistors in both pairs, its source terminal connected to the base terminal of the bipolar transistor in the first pair, and its gate electrode connected to the gate electrodes of the MOSFET transistors in both pairs, the common collector terminal of the bipolar transistors in both pairs, the source terminal of the MOSFET transistor in the second pair, and the common gate electrodes of the MOSFET transistors forming the terminals of the device.

8. A device according to claim 7, comprising:

an outward region of the P type including the channel of the MOSFET drive transistor and extending from the front surface of the at least one layer overlying the substrate in the N-type layer proximate to the outward edge of the isolation region which extends as far as the base region of the bipolar transistor in the first pair;

a region of the N type having a high concentration of impurities and extending from the front surface of the at least one layer overlying the substrate in said outward region of the P type and including the source region of the MOSFET drive transistor;

a strip of an electrically conductive material overlying the channel of the MOSFET drive transistor, being insulated from the front surface of the at least one layer overlying the substrate by a layer of an insulating material, and including the gate electrode of the MOSFET drive transistor;

a region being part of the N-type layer overlying the substrate and being bounded by said outward region of the P type and the substrate and forming, with the latter, the drain region of the MOSFET drive transistor; and electrically conductive means of interconnection between the gate electrode of the MOSFET drive transistor and the common gate electrodes of the MOSFET transistors in both pairs.

9. A device having a bipolar transistor and a MOSFET transistor coupled in an emitter switching configuration, comprising:

an N substrate that has front and back surfaces and a first impurity concentration;

an N layer that adjoins said front surface of said substrate and has a second impurity concentration that is lower than said first;

wherein said substrate and said layer include a collector region of said bipolar transistor;

a metallic layer that adjoins said back surface of said substrate and forms a collector terminal of said bipolar transistor;

a buried P region that is buried in said N layer, includes a base region of said bipolar transistor, and has a third concentration of impurities;

a P isolation region that extends outwardly from said buried P region opposite said substrate and has a fourth impurity concentration that is higher than said third;

a bounded N region that is bounded by said P isolation region and includes a drain region of said MOSFET transistor;

a first contact that adjoins said P isolation region and forms a base terminal of said bipolar transistor;

a buried N region that forms a junction with said base region, includes an emitter region of said bipolar transistor, and has a fifth impurity concentration that is higher than said second;

an N isolation region that is within and bounds a portion of said bounded N region and has a sixth impurity concentration that is higher than said second;

a P region that is within said portion and includes a channel of said MOSFET transistor;

an N region that is within said P region, includes a source region of said MOSFET transistor, and has a seventh impurity concentration that is higher than said second;

a second contact that adjoins said N region and forms a source terminal of said MOSFET transistor;

a third contact that overlies said channel and forms a gate electrode of said MOSFET transistor; and an insulator layer that separates said third contact from said channel.

10. The device of claim 9 wherein said N isolation region adjoins said buried N region.

11. The device of claim 9 wherein said base, collector, and source terminals and said gate electrode compose terminals of the device.

12. A semiconductor device having a bipolar transistor and a MOSFET switching transistor coupled in an emitter switching configuration and a MOSFET drive transistor and said bipolar transistor coupled in a Darlington configuration, the device comprising:

an N substrate that has front and back surfaces and a first impurity concentration;

an N layer that adjoins said front surface of said substrate and has a second impurity concentration that is lower than said first;

wherein said substrate and said layer include a collector region of said bipolar transistor;

a metallic layer that adjoins said back surface of said substrate and forms a collector terminal of said bipolar transistor;

a P region that is buried in said N layer, includes a base region of said bipolar transistor, and has a third concentration of impurities;

a P isolation region that extends outwardly from said buried P region opposite said substrate and has a fourth impurity concentration that is higher than said third;

a bounded N region that is bounded by said P isolation region and includes a drain region of said MOSFET switching transistor;

a first contact that adjoins said P isolation region and forms a base terminal of said bipolar transistor;

a buried N region that forms a junction with said base region, includes an emitter region of said bipolar transistor, and has a fifth impurity concentration that is higher than said second;

an N isolation region that is within and bounds a portion of said bounded N region and has a sixth impurity concentration that is higher than said second;

a P region that is within said portion and includes a channel of said MOSFET switching transistor;

a first N region that is within said P region, includes a source region of said MOSFET switching transistor, and has a seventh impurity concentration that is higher than said second;

a second contact that adjoins said first N region and forms a source terminal of said MOSFET switching transistor;

a third contact that overlies said channel and forms a gate electrode of said MOSFET switching transistor;

a first insulator layer that separates said third contact from said channel;

an outward P region that is within the N layer, adjacent to an outer edge of said P isolation region, and includes a channel of said MOSFET drive transistor;

a second N region that is within said outward P region, includes a source region of said MOSFET drive transistor, and has an eighth impurity concentration that is higher than said second;

a fourth contact that overlies said channel of said MOSFET drive transistor and includes a gate electrode thereof;

a second insulator layer that separates said fourth contact from said channel of said MOSFET drive transistor; and wherein a portion of said N layer that is bounded by said outward P region and said substrate forms with said substrate a drain region of said MOSFET drive transistor.

13. The device of claim 12 wherein said N isolation region adjoins said buried N region.

14. The device of claim 12 wherein a single insulator layer composes both said first and second insulator layers.

15. The device of claim 12 wherein said gate electrodes of said MOSFET switching and drive transistors are electrically coupled.

16. A semiconductor device comprising:

first and second stages each including a bipolar transistor and a MOSFET switching transistor coupled in an emitter switching configuration, each of said stages comprising:

an N substrate that has front and back surfaces and a first impurity concentration;

an N layer that adjoins said front surface of said substrate and has a second impurity concentration that is lower than said first;

wherein said substrate and said layer include a collector region of said bipolar transistor;

a metallic layer that adjoins said back surface of said substrate and forms a collector terminal of said bipolar transistor;

a buried P region that is buried in said N layer, includes a base region of said bipolar transistor, and has a third concentration of impurities;

a P isolation region that extends outwardly from said buried P region opposite said substrate and has a fourth impurity concentration that is higher than said third;

a bounded N region that is bounded by said P isolation region and includes a drain region of said MOSFET switching transistor;

a first contact that adjoins said P isolation region and forms a base terminal of said bipolar transistor;

a buried N region that forms a junction with said base region, includes an emitter region of said bipolar transistor, and has a fifth impurity concentration that is higher than said second;

an N isolation region that is within and bounds a portion of said bounded N region and has a sixth impurity concentration that is higher than said second;

a P region that is within said portion and includes a channel of said MOSFET switching transistor;

a first N region that is within said P region, includes a source region of said MOSFET switching transistor, and has a seventh impurity concentration that is higher than said second;

a second contact that adjoins said first N region and forms a source terminal of said MOSFET switching transistor;

a third contact that overlies said channel and forms a gate electrode of said MOSFET switching transistor; and a first insulator layer that separates said third contact from said channel; and a MOSFET drive transistor coupled in a Darlington configuration with the bipolar transistor of said first stage, said drive transistor comprising:

a P outward region that is within said N layer, is adjacent to an outer edge of said P isolation region of said bipolar transistor in said first stage, and includes a channel of said MOSFET drive transistor;

a second N region that is within said P outward region, includes a source region of said MOSFET drive transistor, and has a ninth impurity concentration that is greater than said second;

a fourth contact that overlies said channel of said MOSFET drive transistor and includes a gate electrode thereof;

a second insulator layer that separates said fourth contact from said channel of said MOSFET drive transistor; and wherein a portion of said N layer that is bounded by said P outward region and said substrate forms with said substrate a drain region of said MOSFET drive transistor.

17. The device of claim 16 wherein said N isolation region adjoins said buffed N region.

18. The device of claim 16 wherein a single insulator layer composes both said first and second insulator layers.

19. The device of claim 16 wherein said gate electrodes of said MOSFET switching and drive transistors are electrically coupled.

20. An integrated circuit, comprising:

a buried base region of a bipolar transistor;

a buried emitter region of said bipolar transistor electrically contacting said base region;

a first deep isolation region having a portion disposed within an outer edge of said buried base region and surrounding said buried emitter region;

a well region adjacent said first deep isolation region and said buried emitter region;

a second deep isolation region disposed within said well region;

a drain region of a MOSFET transistor adjacent said buried emitter and second deep isolation regions;

a body region of said MOSFET transistor formed within said drain region;

a source region of said MOSFET formed within said body region;

a channel region of said MOSFET transistor formed within said body region and adjacent said source and drain regions; and a gate electrode above said channel region.

* * * * *